US 6,707,706 B2

(12) United States Patent
Nitayama et al.

(10) Patent No.: US 6,707,706 B2
(45) Date of Patent: Mar. 16, 2004

(54) SEMICONDUCTOR MEMORY DEVICE AND METHOD FOR MANUFACTURING THE SAME

(75) Inventors: Akihiro Nitayama, Yokohama (JP); Katsuhiko Hieda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 53 days.

(21) Appl. No.: 10/183,156

(22) Filed: Jun. 28, 2002

(65) Prior Publication Data

US 2003/0001290 A1 Jan. 2, 2003

(30) Foreign Application Priority Data

Jun. 29, 2001 (JP) ......................................... 2001-198128

(51) Int. Cl.[7] .............................................. G11C 11/24
(52) U.S. Cl. ...................................... 365/149; 257/301
(58) Field of Search .................. 365/149, 63; 257/301, 257/302

(56) References Cited

U.S. PATENT DOCUMENTS 4,855,952 A * 8/1989 Kiyosumi .................... 365/149
4,860,071 A * 8/1989 Sunami et al. ............... 365/149
6,172,898 B1 * 1/2001 Kajiyama .................... 365/149

OTHER PUBLICATIONS

U. Gruening, et al., "A Novel Trench DRAM Cell with a VERtical Access Transistor and BuriEd STrap (VERIBEST) for 4Gb/16Gb", Dec. 1999, pp. 25–28, IEDM Technical Digest.

* cited by examiner

Primary Examiner—Tan T. Nguyen
(74) Attorney, Agent, or Firm—Banner & Witcoff, LTD.

(57) ABSTRACT

A semiconductor memory device comprises a plurality of columnar portions formed in memory cell array regions on a semiconductor substrate. The columnar portions are isolated from one another by a plurality of trenches, and these trenches have first and second bottoms that are different in depth. The semiconductor device comprises a plurality of cell transistors which include first diffusion layer regions formed in the first bottoms, which are shallower than the second bottoms, second diffusion layer regions formed in surface portions of the columnar portions, and a plurality of gate electrodes which are adjacent to both the first and second diffusion layer regions and extend along at least one side-surface portions of the columnar portions.

25 Claims, 15 Drawing Sheets

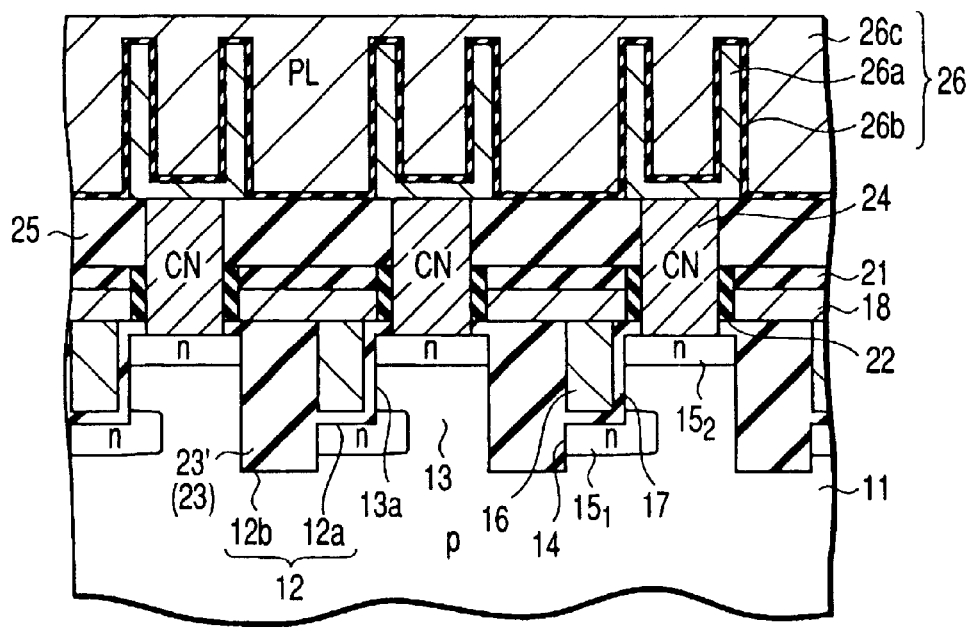
F I G. 2A
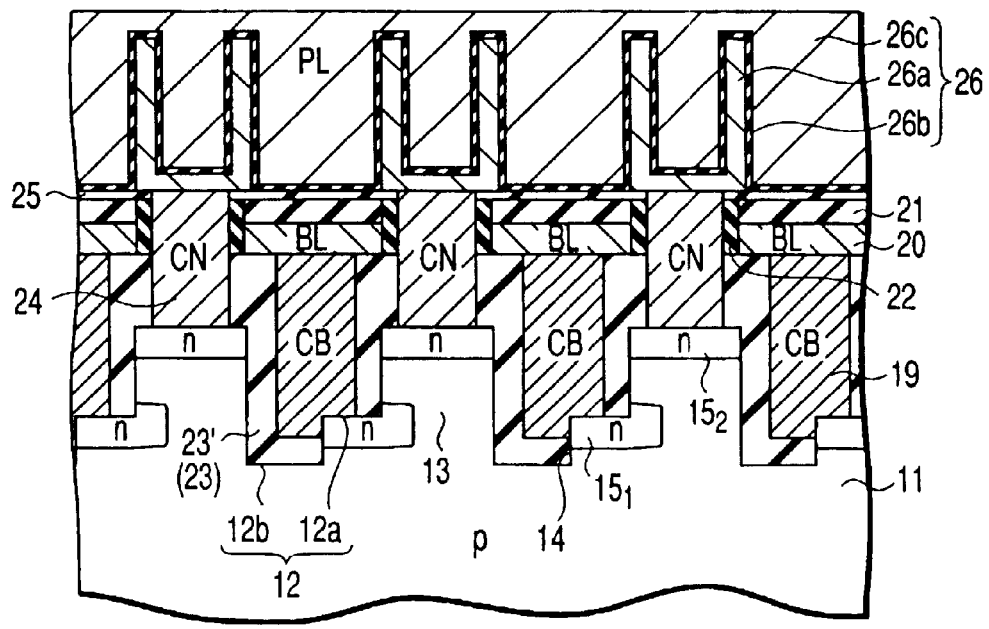
F I G. 2B

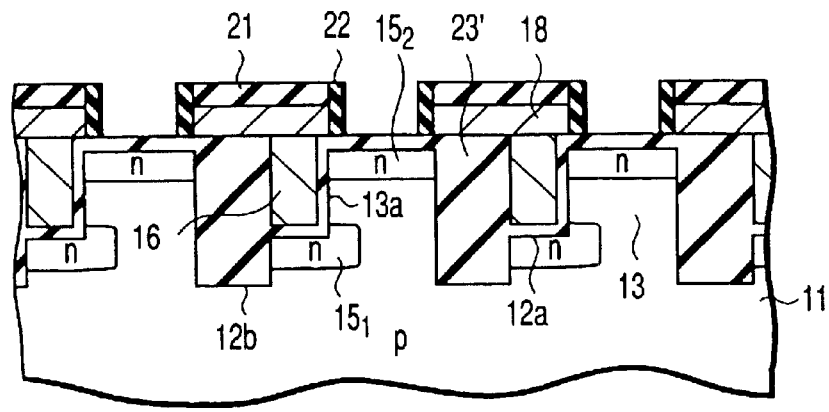
F I G. 5A
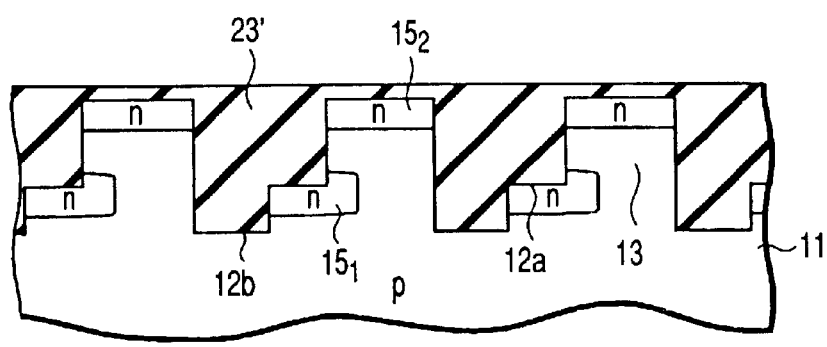
F I G. 5B
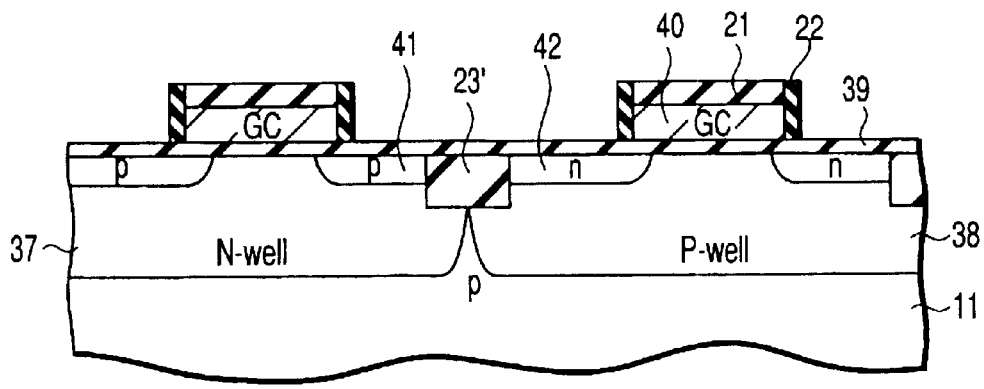
F I G. 5C

SEMICONDUCTOR MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2001-198128, filed Jun. 29, 2001, the entire contents of which are incorporated herein by reference.

BACKGROUND OF THE INVENTION

1. Field of the Invention

The present invention relates to a semiconductor memory device and a method for manufacturing the same. More specifically, the present invention relates to highly-integrating technology for memory cells of a dynamic random access memory (DRAM).

2. Description of the Related Art

In recent years, the miniaturization and high-integration of semiconductor memory devices, especially those of DRAMs, are making remarkable progress. In accordance with this, more and more memory cells with very limited areas have been developed.

In the past, DRAMs have been miniaturized and integrated, without changing the planar structure of the cell transistors of memory cells. For this reason, the cell transistors have become very hard to design. To be more specific, planar type cell transistors must suppress a short channel effect and have an improved retention characteristic, but these two requirements are hard to satisfy simultaneously when they are miniaturized. In effect, further improvement cannot be expected on this matter. Nevertheless, there is a requirement that the cell areas be reduced further.

FIGS. 16A and 16B show the cell structure of a conventional DRAM. FIG. 16A is a plan view showing the cell layout of an $8F^2$ type, for example, and FIG. 16B is a sectional view taken along line 16B—16B of FIG. 16A.

As shown in these Figures, the occupation area of one memory cell is determined by planar type cell transistor 101, one bit line contact (CB) 103 shaped by two cells, and an element isolation region 105. In FIGS. 16A and 16B, reference numeral 107 denotes an active area (AA), numeral 109 denotes a p-type silicon substrate, numeral 111 denotes a word line, numeral 113 denotes an SiN film, numeral 115 denotes an interlayer film, numeral 117 denotes a capacitor contact (storage node contact [CN]), and numeral 119 denotes a bit line (BL). Reference numeral 121 denotes a cell capacitor including a storage electrode (SN) 121a, a capacitor dielectric film 121b and a plate electrode (PL) 121c.

Let us assume that a minimum working dimension is F and that a gate electrode (word line (WL)) 101a and a diffusion layer 101b (which is to function as a source or drain) have sides that are designed based on F. In this case, the minimum occupation area of a memory cell is $8F^2$ (the length is 2F, and the width is 4F). As can be seen from this, the miniaturization and integration of a DRAM wherein each memory cell includes one transistor and one capacitor have made progress based on the $8F^2$ type cell layout.

In the planar type cell transistor 101, however, the gate length decreases in accordance with a decrease in the cell area, and the short channel effect is hard therefore to suppress. To effectively suppress the short channel effect, a leak between depletion layers 101b should be reduced, and this is attained by increasing the boron concentration of a channel section (in the case where a substrate 109 is a p-type). On the other hands, it is required that the retention characteristic be further improved since the retention characteristic plays an important role in determining the performance of a DRAM. To improve the retention characteristic, the junction leak at the capacitor side, which adversely affects the retention characteristic, must be reduced. This is attained by decreasing the boron concentration of the channel section in the neighborhood of the capacitor-side junction (in the case where the substrate is a p-type).

As described above, in the DRAM, one requirement is attained by increasing the impurity concentration in the channel section of a cell, and another requirement is attained by decreasing the same impurity concentration. In other words, these requirements are in trade-off relationships in terms of the impurity concentration of the channel section. Moreover, the recent severe cost competition requires that the cell area be further reduced and the chips (DRAM) be further miniaturized and integrated. However, in the $8F^2$ type cell layout shown in FIG. 16A, the cell area is already that of the theoretical limitation (i.e., the cell area is none other than $8F^2$). Under the circumstances, the required reduction in the cell areas cannot be attained, and the further miniaturization and integration of chips cannot be met.

As described above, further reduction in the size of cell areas and further miniaturization and integration of chips are required in the conventional art. These requirements, however, cannot be met since the suppression of the short channel effect of a cell transistor and the improvement of the retention characteristic are hard to satisfy simultaneously in the case of the $8F^2$ type cell layout.

BRIEF SUMMARY OF THE INVENTION

A semiconductor memory device according to an embodiment of the present invention comprises: a plurality of columnar portions formed in memory cell array regions on a semiconductor substrate, the columnar portions being isolated by a plurality of trenches having first and second bottoms which are different in depth; a plurality of cell transistors including first diffusion layer regions formed in the first bottoms shallower than the second bottoms, second diffusion layer regions formed in surface portions of the columnar portions, and a plurality of gate electrodes which are adjacent to the first and second diffusion layer regions and extending along one side surface of each columnar portion; a plurality of word lines connected to the gate electrodes, respectively; a plurality of bit lines extending in a direction intersecting with the word lines and connected to the first diffusion layer regions, respectively; and a plurality of cell capacitors connected to the second diffusion layer regions, respectively.

A semiconductor memory device-manufacturing method according to an embodiment of the present invention comprises: providing a plurality of columnar portions by forming a plurality of first trenches of a first depth in memory cell array regions of a semiconductor substrate; forming a plurality of first diffusion layer regions by forming first impurity layers in bottoms of the first trenches; filling the first trenches with a gate electrode material; selectively removing the gate electrode material from the first trenches by forming a plurality of second trenches of a second depth deeper than the first depth, such that a plurality of gate electrodes extend at least along one-side portions of the columnar portions; forming a plurality of element isolation regions by filling the second trenches with an insulating film; forming a plurality of word lines which are connected to the gate electrodes; forming a plurality of second diffusion layer regions by forming second impurity layers in surface portions of the columnar portions; forming a plurality of bit line contacts which are connected to the first diffusion layer regions; forming a plurality of bit lines which are connected to the bit line contacts; forming a plurality of capacitor contacts which are connected to the second diffusion layer regions; and forming a plurality of cell capacitors which are connected to the capacitor contacts.

BRIEF DESCRIPTION OF THE SEVERAL VIEWS OF THE DRAWING

FIG. 2A is a sectional view showing how the cell structure of the DRAM is in the section taken along line 2A—2A of FIG. 1, and FIG. 2B is a sectional view showing how the cell structure of the DRAM is in the section taken along line 2B—2B of FIG. 1.

FIGS. 5A to 5C are sectional views which illustrate the method for manufacturing the DRAM shown in FIG. 1.

DETAILED DESCRIPTION OF THE INVENTION

Embodiments of the present invention will now be described with reference to the accompanying drawings.

(First Embodiment)

Figure 1:
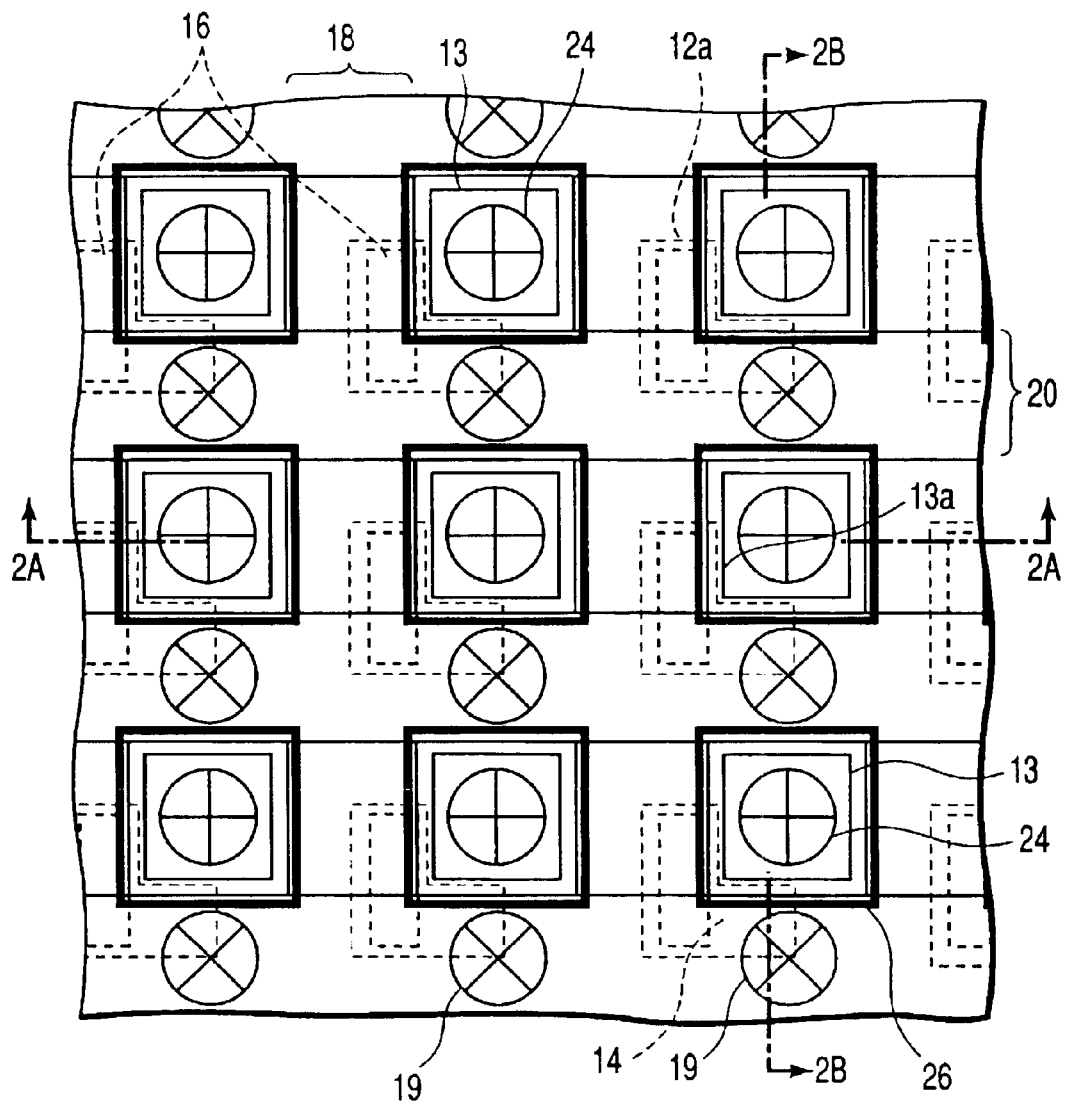
FIG. 1 is a plan view showing the cell layout of a DRAM according to the first embodiment of the present invention.

FIG. 1 and FIGS. 2A and 2B show the cell structure of a DRAM according to the first embodiment of the present invention. FIG. 1 is a plan view showing the cell layout, and FIGS. 2A and 2B are sectional views taken along lines 2A—2A and 2B—2B of FIG. 1, respectively.

As shown in FIGS. 2A and 2B, a plurality of trenches 12 are formed in the surface portion of a p-type silicon substrate (semiconductor substrate). The trenches 12 are provided in correspondence to respective memory cell array regions. Each trench includes a first trench 12a (which is a shallow trench) and a second trench 12b (which is a trench deeper than the first trench 12a). Silicon columns 13 are formed between the adjacent ones of the trenches 12. As shown in FIG. 1, the silicon columns are laid out in a matrix pattern at intervals corresponding to the minimum design rule.

As shown in FIG. 1, the first trenches 12a (shallow trenches) are shifted by half a pitch in each direction of the matrix pattern. As shown in FIGS. 2A and 2B, first and second diffusion regions $15_1$ and $15_2$ (which are n-type impurity layers) are formed separately from each other. The first diffusion regions $15_1$ are located at silicon pedestals 14, which correspond to the bottom portions of the shallow first trenches 12a, and the second diffusion regions $15_2$ are located in the surface portions of the silicon columns 13. The diffusion regions $15_1$ and $15_2$ serve as sources and drains of cell transistors.

A vertical type of gate electrode 16 is formed in each of the first trenches 12a. As shown, for example, in FIG. 2A, the gate electrode 16 extends along one side surface 13a of the corresponding silicon column 13, and a gate insulating film 17 is located between the gate electrode and the side surface 13a. The gate electrode 16 is rectangular and looks like having a substantially "I"-shaped surface when viewed from above, as can be seen from FIG. 1. In conjunction with the diffusion regions $15_1$ and $15_2$ described above, the gate electrode 16 forms a vertical cell transistor, wherein the side surface 13a functions as a channel section. The gate electrode 16 is connected to a corresponding word line (WL) 18.

As shown in FIG. 2B, bit line contacts (CB) 19 are connected at one end to either diffusion layer regions $15_1$ or $15_2$. They are connected to diffusion layer regions $15_1$, for example. At the other end, the bit line contacts 19 are connected to corresponding bit lines (BL) 20. These bit lines 20 are arranged to be substantially orthogonal to the word lines 18. The word lines 18 and the bit lines 20 have their upper surfaces covered with silicon nitride films 21 and have their side surfaces covered with silicon nitride films 22. A silicon oxide ($SiO_2$) film 23 is formed in each trench 12, thereby providing element isolation 23'.

The diffusion layer regions $15_1$ or $15_2$ that are not connected to the bit line contacts 19, for example diffusion layer regions $15_2$, are connected to one-end portions of capacitor contacts (storage node contacts CN). The capacitor contacts 24 are arranged utilizing the spaces between the word lines 18 and the bit lines 20. The other-end portions of the capacitor contacts 24 are connected to cell capacitors 26 formed on interlayer films 25. Each of the cell capacitors 26 includes a storage electrode (lower capacitor electrode) 26a, a capacitor dielectric film 26b, and a plate electrode (upper capacitor electrode PL) 26c.

In the first embodiment, memory cells are arranged at the intersections between the word lines 18 and the bit lines 20, as shown in FIG. 1. In other words, the first embodiment provides a layout structure for cross-point type cells. Each memory cell includes a vertical cell transistor and a cell capacitor 26 (that is, a memory cell is made up of one transistor and one capacitor). Assuming that the minimum working dimension of the memory cells is F, the minimum occupation area is $4F^2$ per cell (the pitch of the word lines 18 is 2F, and the pitch of the bit lines 20 is 2F).

A description will now be given of a process for manufacturing the DRAM of the first embodiment, with reference to FIGS. 3A–3C and FIGS. 7A–7C. FIGS. 3A, 4A, 5A, 6A and 7A are sectional views taken along line 2A—2A of FIG. 1, FIGS. 3B, 4B, 5B, 6B and 7B are sectional views taken along line 2B—2B of FIG. 1, and FIGS. 3C, 4C, SC, 6C and 7C are sectional views showing peripheral regions (peripheral circuit regions) of array regions.

Figure 3A:
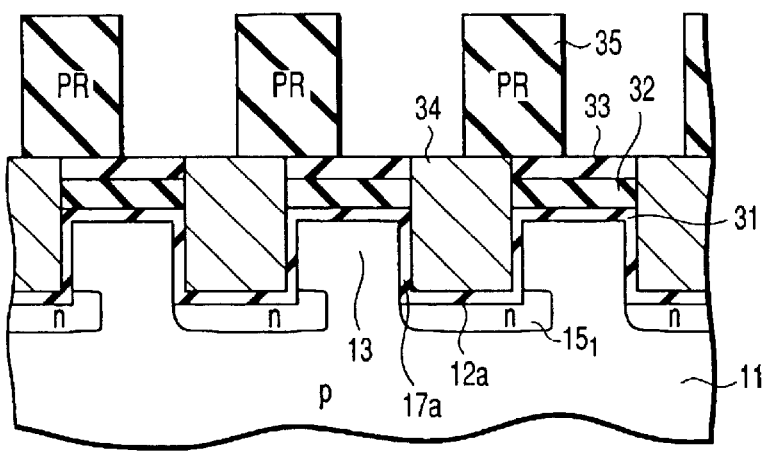
FIGS. 3A to 3C are sectional views which illustrate the method for manufacturing the DRAM shown in FIG. 1.
Figure 3B:
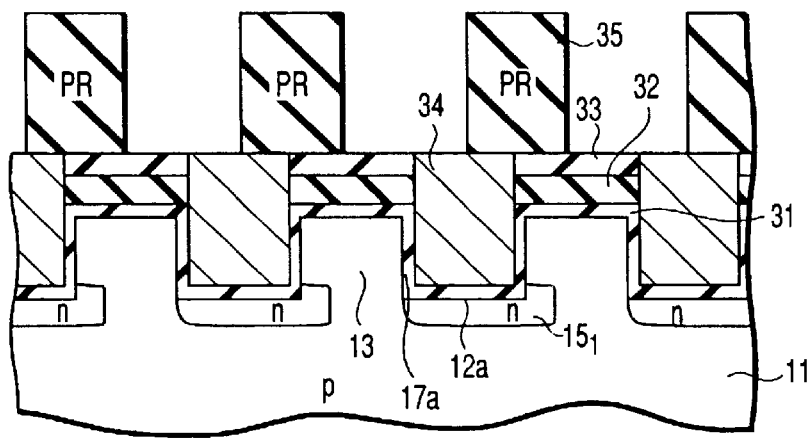
Figure 3C:
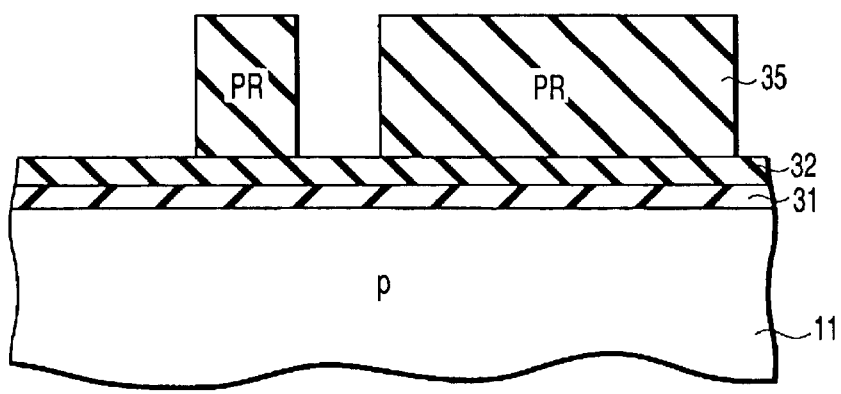

As shown, for example, in FIGS. 3A and 3B, a Pad oxide film 31, a Pad nitride film 32 and a second Pad oxide film 33 are sequentially deposited on the p-type silicon substrate 11 by CVD (Chemical Vapor Deposition) in the order mentioned. Subsequently, a resist pattern (not shown) used for forming silicon columns 13 is worked by photolithography. The second Pad oxide film 33, the Pad nitride film 32 and the Pad oxide film 31 are sequentially worked by RIE (Reactive Ion Etching), using the resist pattern as a mask. After the resist pattern is removed, the silicon substrate 11 is etched by RIE, using the second Pad oxide film 33, the Pad nitride film 32 and the Pad oxide film 31 as a mask. By this etching, shallow first trenches 12a are formed in the array regions, thereby forming the silicon columns 13 described above. Then, the side surfaces of the silicon columns 13 are oxidized, thereby forming oxide films 17a, which serve as the gate insulating films 17. Subsequently, the bottom portions (silicon pedestals 14) of the first trenches 12a are doped with ions by oblique ion implantation, thereby forming diffusion layer regions (first diffusion layers) $15_1$. If this ion implantation degrades the quality of the oxide films 17a, these oxide films 17a are removed and new oxide films 17a are formed instead. Then, a polycrystalline silicon film 34 is deposited over the entire surface of the resultant structure. The polycrystalline silicon film 34 is recessed by CMP (Chemical Mechanical Polishing) in such a manner that it is left inside the shallow first trenches 12a. At the time, the second Pad oxide film 33 is used as a stopper. Thereafter, as can be seen from the film structure shown in FIG. 3C, the second Pad oxide film 33 is selectively etched out in the peripheral regions of the array regions by photolithography and wet etch processing. As shown in FIGS. 3A to 3C, a resist pattern (PR) 35 used for forming an active region is worked.

Figure 4A:
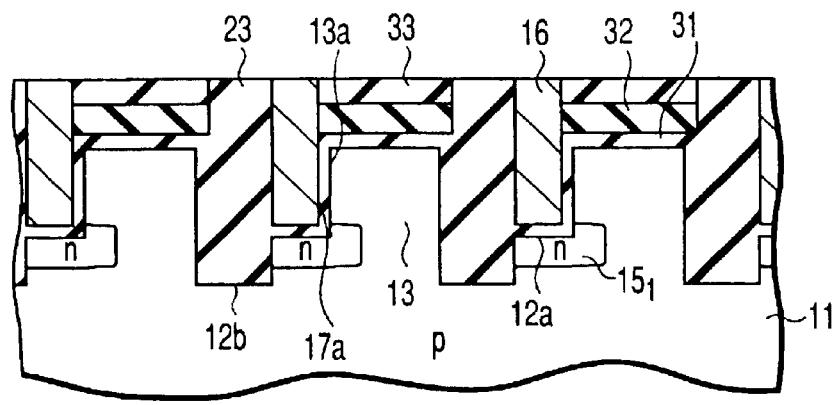
FIGS. 4A to 4C are sectional views which illustrate the method for manufacturing the DRAM shown in FIG. 1.
Figure 4B:
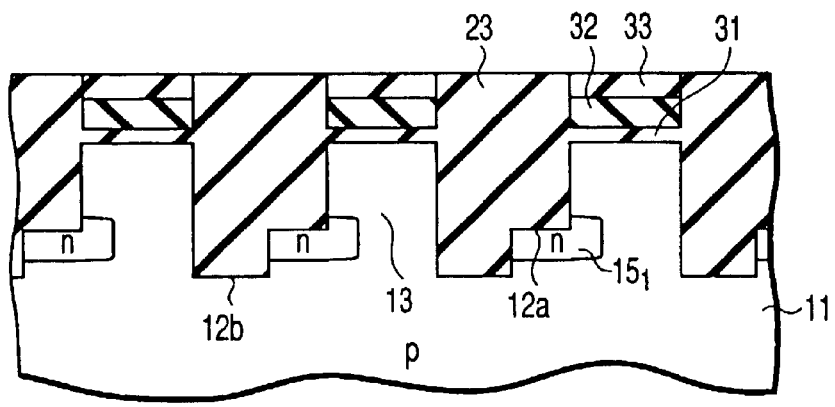
Figure 4C:
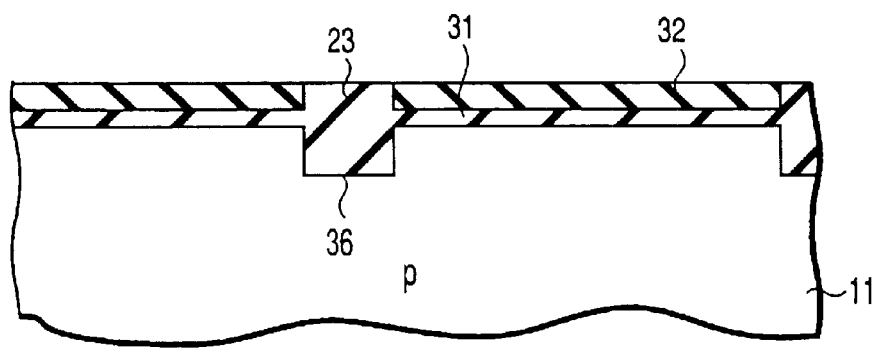

As shown, for example, in FIG. 4C, the Pad nitride film 32 is patterned in the peripheral regions of the array regions. This patterning is executed under the SiN-RIE etching condition, using the resist pattern 35 as a mask. Subsequently, as shown in FIGS. 4A and 4B, the polycrystalline silicon film 34 is patterned in the array regions after the etching condition is changed to Poly-RIE. At the time, the resist pattern 35, the second Pad oxide film 33 and the Pad oxide film 31 are used as a mask (critical mask). As a result, vertical-type gate electrodes 16, whose lower portions are similar in shape to the bottom portions (silicon pedestals) of the first trenches 12a, are formed on the bottom portions of the first trenches 12a (FIG. 4A). As shown in FIGS. 4B and 4C, the Pad oxide film 31 and the oxide films 17a are worked or removed by RIE. After the resist pattern 35 is removed, the silicon substrate 11 is etched under the Si-RIE etching condition in such a manner that second trenches 12b (which are deep and used for element isolation) and trenches 36 are formed, as shown in FIGS. 4A to 4C. Then, as shown in FIGS. 1 and 4B, those portions of the gate electrodes 16 which would be adjacent to the bit line contacts 19 (i.e. portions other than the one-side surface portions 13a). A silicon oxide film 23 is deposited over the entire surface of the resultant structure by CVD, and is then recessed in such a manner that it is left only in the trenches 12a, 12b and 36.

As shown in FIGS. 5A to 5C, element isolation 23' is completed by removing the second Pad oxide film 33, recessing the gate electrodes 16, and removing the Pad nitride film 32. What should be noted here is that element isolation 23' is attained simultaneously in both the array regions and their peripheral regions and the steps required can be simplified, accordingly. As shown in FIG. 5C, an N-well region 37 and a P-well region 38 are formed in the peripheral regions of the array regions by executing ion implantation through the use of the Pad oxide film 31. After the Pad oxide film 31 is removed, a gate insulating film 39, which is an oxide film, is formed. Of this oxide film, those portions which are located on the gate electrodes 16 are removed by photolithography and wet etch processing. As shown in FIGS. 5A and 5C, a second polycrystalline film and a silicide film (or a metal film), which are to serve as word lines 18 in the array regions and gate electrodes (GC) 40 in the peripheral regions, are deposited by CVD. The resultant structure is overlaid with a silicon nitride film 21, which are to serve as a cap) by CVD. Gates (word lines 18 and gate electrodes 40) are worked by photolithography and RIE. Subsequently, silicon nitride films 22, serving as spacers, are deposited by CVD, and the deposited silicon nitride films 22 are worked by CVD in such a manner that their portions located on the side wall are left. Then, as shown in FIGS. 5A to 5C, ion implantation is executed in such a manner that diffusion layer regions (second diffusion layers) are formed in the upper portions of the silicon columns 13 in the array regions, and that diffusion regions 41 and 42 serving as sources or drains of transistors are formed in the peripheral regions. In the array regions, therefore, the vertical-type gate electrodes 16 and the diffusion layer regions $15_1$ and $15_2$ define vertical-type cell transistors, wherein one-side portions of the silicon columns 13 function as channel sections.

Figure 6A:
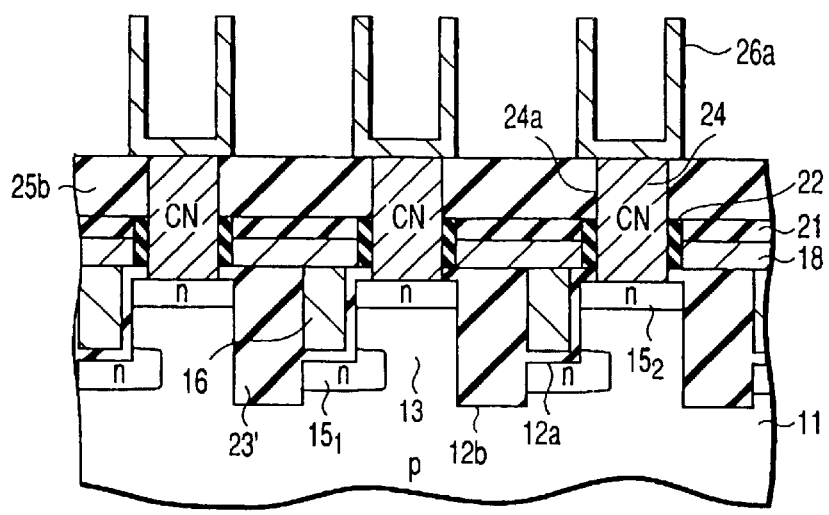
FIGS. 6A to 6C are sectional views which illustrate the method for manufacturing the DRAM shown in FIG. 1.
Figure 6B:
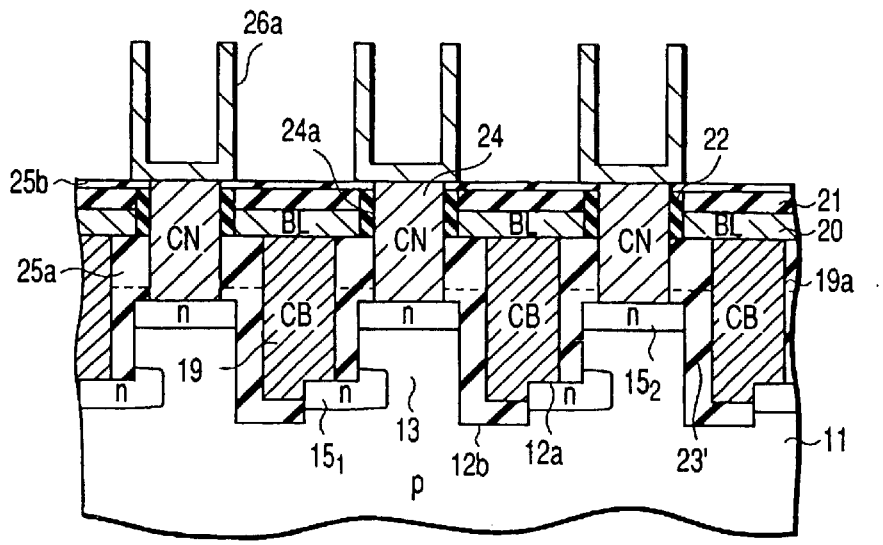
Figure 6C:
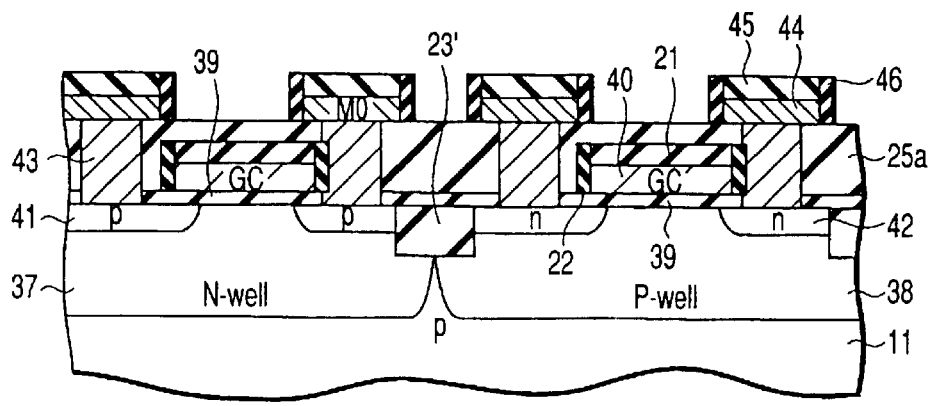

After an interlayer film 25a is formed, contact holes 19a for the bit line contacts 19 are formed in the array regions. The contact holes 19a reach the diffusion layer regions $15_1$ formed in the silicon pedestals 14, as shown in FIG. 6B. Then, in order to ensure reliable insulation between the bit line contacts 19 and the silicon columns 13 (or gate electrodes 16), spacers (not shown) made of silicon nitride films are formed inside the contact holes 19a. A barrier metal film and a tungsten film are deposited over the resultant structure, and the bit contacts 19 are completed by working them by CMP. The bit line contacts 19 are formed in self-alignment with the word lines 18. Next, a silicon nitride film 21, which is later used as a bit line material and a cap, is deposited, for example, by CVD, and bit lines 20 are formed by working the deposited silicon nitride film 21 by photolithography and RIE. In addition, a silicon nitride film 22, which is later used as spacers of the bit lines 20, is deposited, for example, by CVD, and the deposited silicon nitride film 22 is worked by RIE in such a manner that it is left on the side wall portions. As shown, for example, in FIGS. 6A and 6B, an interlayer film 25b is deposited in the array regions, and contact holes 24a for the capacitor contacts 24 are formed. A barrier metal film and a tungsten film are further deposited, and the deposited films are worked by CMP, thereby completing the capacitor contacts 24. The capacitor contacts 24 are formed in self-alignment with the word lines 18 and the bit lines 20. Next, storage electrodes 26a having a cylinder structure, for example, are formed on the capacitor contacts 24. The storage electrodes 26a need not be of cylinder structure; they may be of any structure including a concave structure or a pedestal structure. When the bit line contacts 19 and the bit lines 20 are formed (alternatively, before or after they are formed), contacts 43 leading to the diffusion layers 41 and 42, wiring layers (MO) 44 leading to the contacts 43, and caps 45 and spacers 46 for the wiring layers 44 are formed, as shown in FIG. 6C.

Figure 7A:
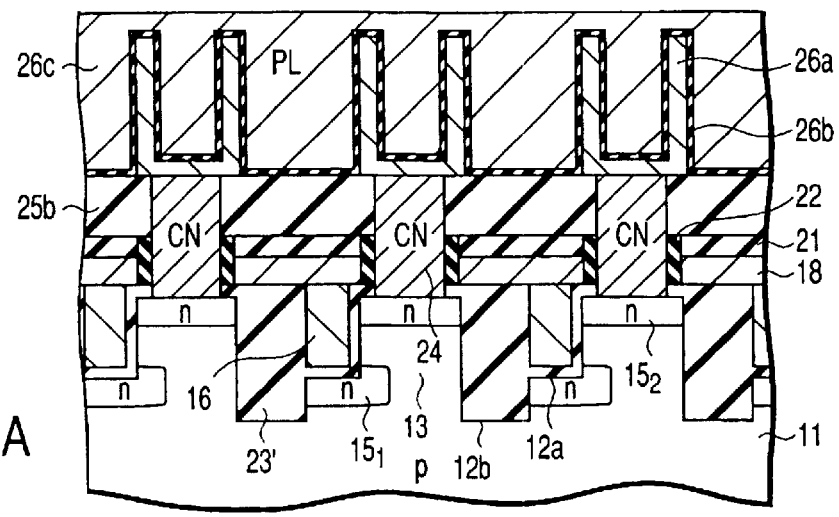
FIGS. 7A to 7C are sectional views which illustrate the method for manufacturing the DRAM shown in FIG. 1.
Figure 7B:
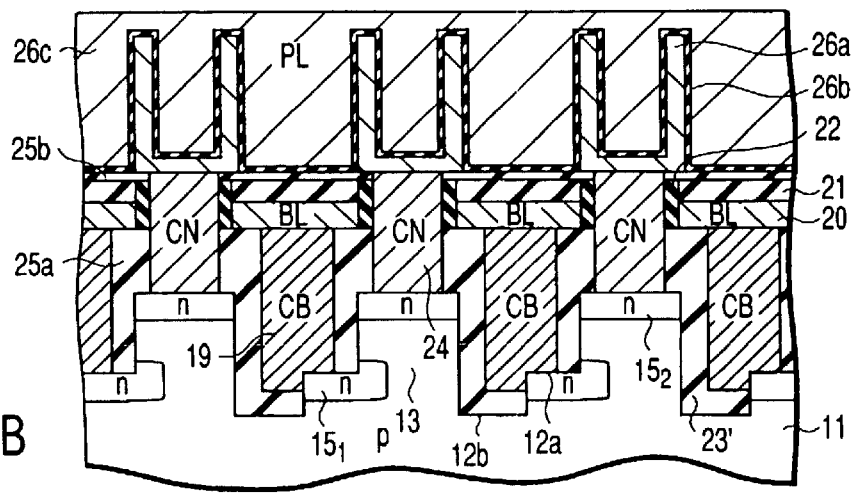
Figure 7C:
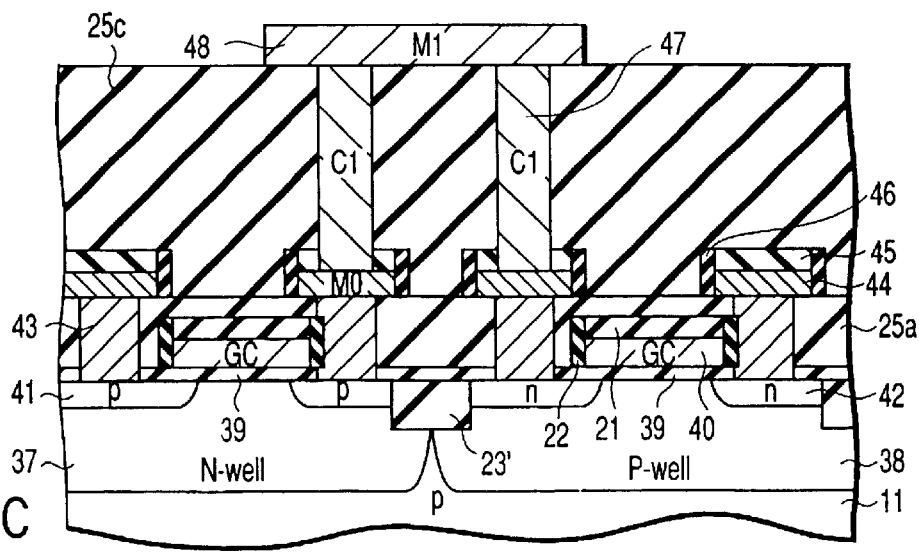

In the array regions, a capacitor dielectric film 26b and a plate electrode 26c, both for the cell capacitors 26, are deposited and worked, as shown in FIGS. 7A and 7B. Thereafter, in the peripheral regions of the array regions, wiring layer-forming steps, such as the steps of forming wiring vias (C1) 47 and wiring layers (M1) 48, are executed with respect to the interlayer film 25c. In this manner, a DRAM (DRAM cell) having such a cell structure as shown in FIGS. 1, 2A and 2B is completed.

As described above, the DRAM of the above embodiment employs vertical-type cell transistors. In other words, the cell transistors are a vertical type in a layout structure for cross-point type cells. This structure enables controlling the boron concentration in the channel section and the boron concentration in the junction at the capacitor side independently of each other. Hence, the suppression of the short channel effect and the improvement of a retention characteristic are attained, and yet the cell layout can be determined based on $4F^2$ type.

In particular, the suppression of the short channel effect of a transistor and the improvement of the retention characteristic are attained at the same time, and the adoption of the vertical-type gate electrodes enables efficient use of the space. Hence, the cell area can be significantly reduced, and the life of the DRAM cells can be remarkably lengthened.

It should be also noted that the cell capacitors can be formed using the conventionally known technology. This ensures a high degree of flatness of the bit lines, and a high manufacturing yield is attained.

(Second Embodiment)

Figure 8:
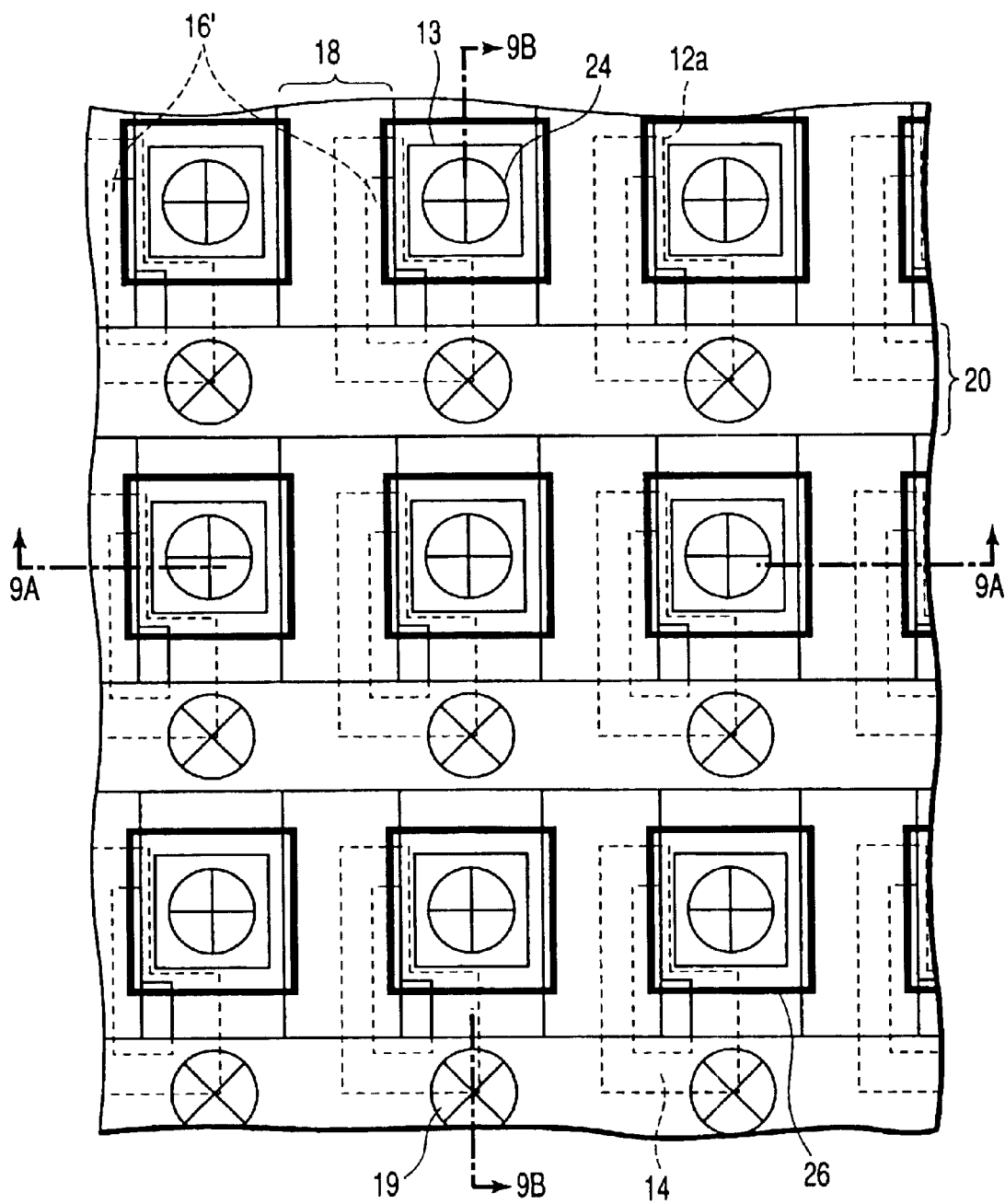
FIG. 8 is a plan view showing the cell layout of a DRAM according to the second embodiment of the present invention.
Figure 9A:
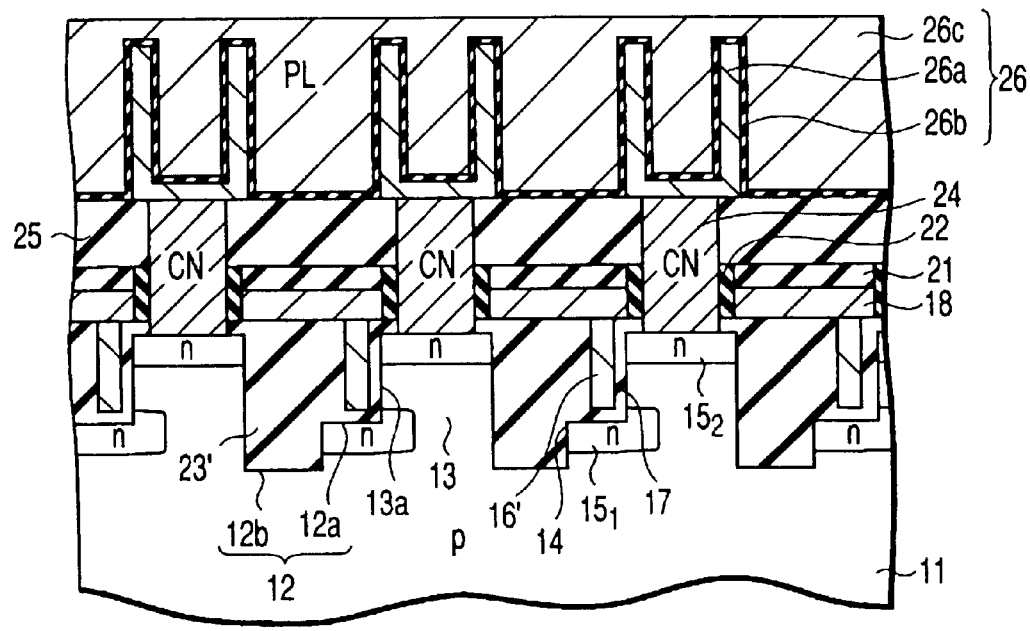
FIG. 9A is a sectional view showing how the cell structure of the DRAM is in the section taken along line 9A—9A of FIG. 8.
Figure 9B:
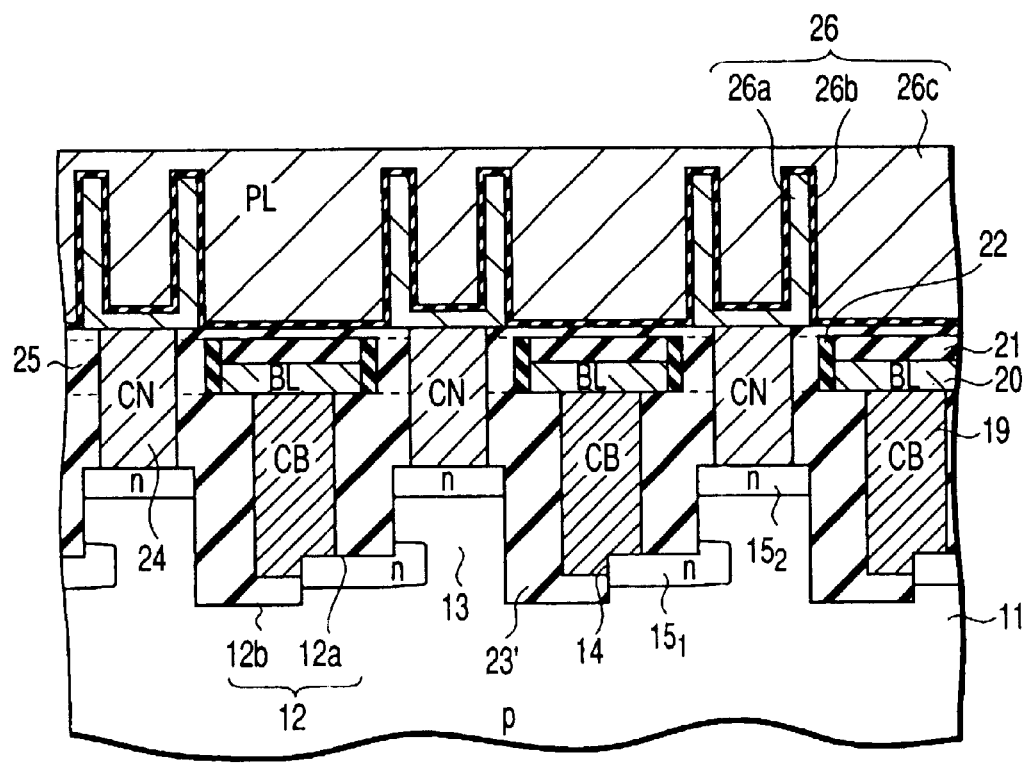
FIG. 9B is a sectional view showing how the cell structure of the DRAM is in the section taken along line 9B—9B of FIG. 8.

FIG. 8 and FIGS. 9A and 9B show the cell structure of a DRAM according to the second embodiment of the present invention. FIG. 8 is a plan view showing the cell layout, and FIGS. 9A and 9B are sectional views taken along lines 9A—9A and 9B—9B of FIG. 8, respectively.

As shown, for example, in FIGS. 8 and 9A and 9B, according to the second embodiment, the vertical-type gate electrodes 16' of the vertical cell transistors are formed in self-alignment with the silicon pedestals 14 (i.e., with the shallow first trenches 12a). In this point, the second embodiment differs greatly from the first embodiment.

In the second embodiment, a polycrystalline silicon film 34 is worked by isotropic etching. This etching allows the vertical-type gate electrodes 16' to be formed in self-alignment with the silicon pedestals 14. That is, unlike the first embodiment, the second embodiment eliminates the need to employ such a mask (critical mask) as required for forming gates (FIGS. 3A to 3C).

As shown, for example, in FIG. 8, the pitch of bit lines 20 is increased from 2F to 3F (F: minimum working dimension) so as to ensure reliable insulation between bit line contacts 19 and the vertical-type gate electrodes 16'. The minimum occupation area is $6F^2$ per cell (the pitch of word lines 18 is 2F).

As shown, for example, in FIG. 8, each vertical-type gate electrode 16' looks like having a substantially "L"-shaped surface when viewed from above. It extends along the adjoining side surfaces of one corner of a silicon column 13 and surrounds part of the silicon column 13. In the section taken along line 9B—9B of FIG. 8, however, the vertical-type gate electrode 16' does not exist, as can be seen from FIG. 9B. This structure prevents the bit line contacts 19 from short-circuiting, and yet increases the gate width of each vertical-type cell transistor. As compared to the first embodiment, the vertical-type cell transistors of the second embodiment provide a high driving power and are therefore suitable for a high-speed operation.

As described above, the second embodiment makes good use of corners of silicon columns so as to reduce the substrate bias effect of the vertical-type cell transistors. As a result, the vertical-type cell transistors are improved in the slope characteristic of sub-threshold leak and enable a high-speed operation on low voltage.

To form vertical-type gate electrodes, shallow first trench 12a are filled with a polycrystalline silicon film 34 (see FIG. 3A), and side etching is executed by CDE (chemical dry etching), without the resist pattern 35 being removed. In this manner, the vertical-type gate electrodes 16' are formed in self-alignment with the corresponding silicon pedestals 14, as shown in FIGS. 9A and 9B. As compared to the vertical-type gate electrodes 16 of the first embodiment, the vertical-type gate electrodes 16' of the second embodiment are slim. To be more specific, the gate electrodes 16' of the second embodiment are reduced in terms of the thickness as measured in the section taken along line 9A—9A of FIG. 8, and are smaller than the bottom portions of the first trenches 12a. Thereafter, the Pad oxide film 31 and the oxide film 17a are removed by RIE. After the resist pattern 35 is removed, the silicon substrate 11 is etched under the Si-RIE etching condition. In this manner, deep second trenches 12b used for element isolation in the array regions and trenches 36 used for element isolation in the peripheral regions are formed. Then, a silicon oxide film 23 used for element isolation is deposited by CVD, and the deposited film is recessed by CMP, thereby providing element isolation 23'.

By executing the subsequent steps, which are similar to those of the first embodiment, a DRAM shown in FIGS. 8, 9A and 9B is completed.

(Third Embodiment)

Figure 10:
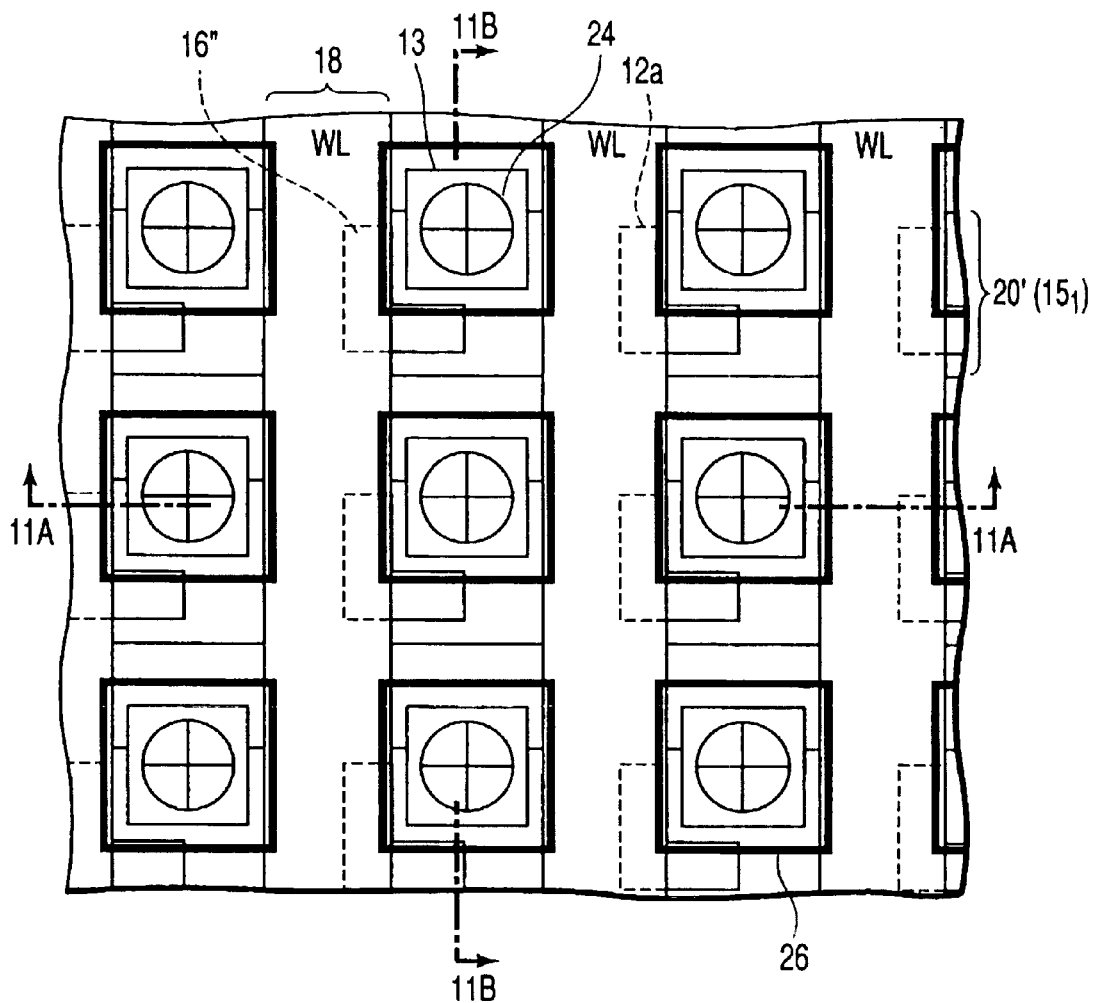
FIG. 10 is a plan view showing the cell layout of a DRAM according to the third embodiment of the present invention.
Figure 11A:
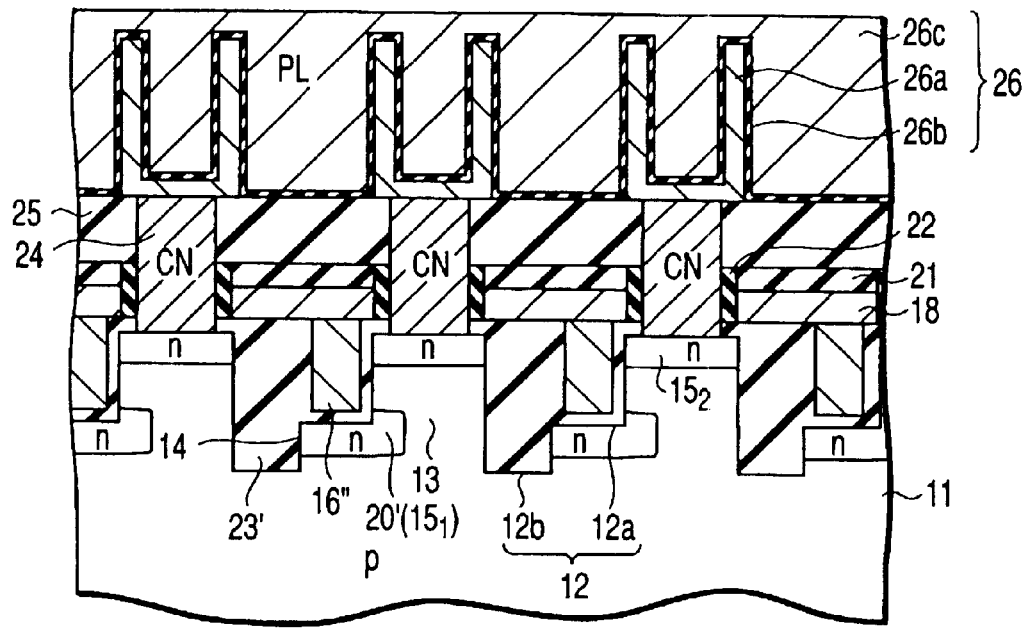
FIG. 11A is a sectional view showing how the cell structure of the DRAM is in the section taken along line 11A—11A of FIG. 10.
Figure 11B:
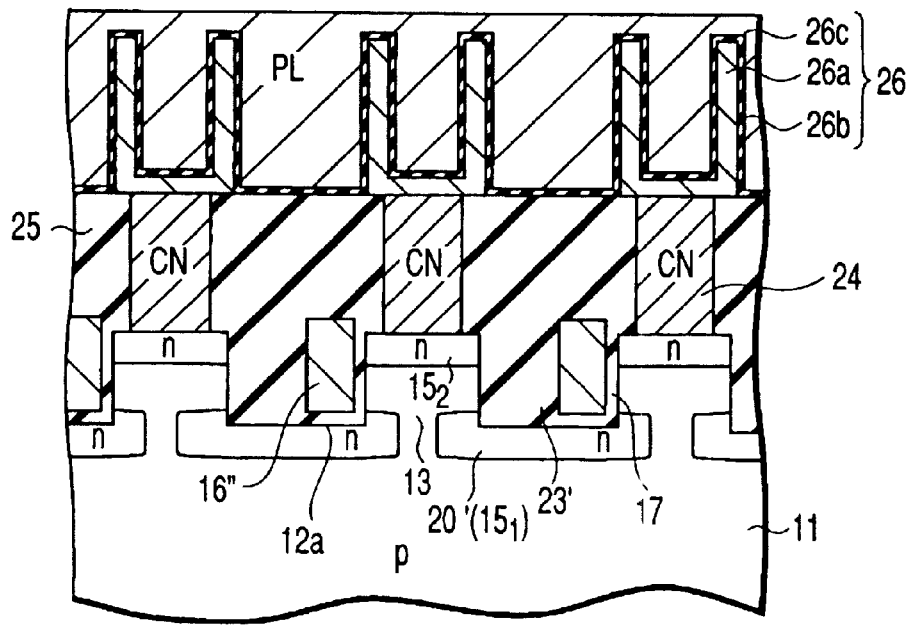
FIG. 11B is a sectional view showing how the cell structure of the DRAM is in the section taken along line 11B—11B of FIG. 10.

FIG. 10 and FIGS. 11A and 11B show the cell structure of a DRAM according to the third embodiment of the present invention. FIG. 10 is a plan view showing the cell layout, and FIGS. 11A and 11B are sectional views taken along lines 11A—11A and 11B—11B of FIG. 10, respectively. The pitch of word lines 18 is 2F, and the pitch of bit lines 20' is 1F. Hence, the minimum occupation area is $2F^2$ per cell.

In the case of the third embodiment, bit lines 20' are linear wiring layers made of diffusion regions $15_1$ formed in the bottoms of trenches 12 (in the embodiment, in the bottoms of shallow first trenches 12a), as shown in FIGS. 10, 11A and 11B. In this point, the third embodiment differs greatly from the first and second embodiments. In other words, the bit lines 20 described above in relation to the first and second embodiments are diffusion layer regions $15_1$ in the DRAM of the third embodiment.

In the third embodiment, the contacts 19 between the bit lines 20 and the diffusion layer regions $15_1$ need not be located inside cells. This being so, the silicon columns 13 and the vertical-type gate electrodes 16" are prevented from short-circuiting to the bit line contacts 19. It should be noted in particular that the position of the bit line contacts 19 is hard to control in the depth direction. If the bit line contacts 19 are at a too shallow or deep position, their contact performance may be adversely affected. Since this problem does not occur, the manufacturing yield is high, and the steps required can be simplified.

In the third embodiment, each vertical-type gate electrode 16" may be shaped substantially in the form of "L", as in the second embodiment. Where each gate electrode 16" is shaped in this manner, it extends along the adjoining side surfaces of one corner of a silicon column 13 and surrounds part of that silicon column 13. This structure increases the gate width of each vertical-type cell transistor. As compared to the first embodiment, the vertical-type cell transistors of the third embodiment provide a high driving power and are therefore suitable for a high-speed operation. The third embodiment makes good use of corners of silicon columns 13 so as to reduce the substrate bias effect of the vertical-type cell transistors. As a result, the vertical-type cell transistors are improved in the slope characteristic of sub-threshold leak and enable a high-speed operation on low voltage.

A description will be given as to how the bit lines 20' are manufactured. First of all, the side surfaces of the silicon columns 13 are oxidized, so as to form oxide layers 17a functioning as gate insulating films 17 (see FIG. 3A). Subsequently, diffusion layer regions (first impurity layers) $15_1$ are formed by vertical ion implantation (in place of oblique ion implantation). As a result, bit lines 20', which serve as diffusion layer regions $15_1$ as well, are formed in the bottom regions (silicon pedestals 14) of the shallow first trenches 12a.

In the above embodiments, those portions of the gate electrodes 16 which would be adjacent to the bit line contacts 19 (i.e. portions other than the one-side surface portion 13a of the silicon column 13) are removed by photolithography and Poly-RIE etching, as shown in FIG. 4B. This step is omitted in the case of the third embodiment. However, bit line contacts connected to sense amplifiers are formed in the peripheral regions of the array regions, by executing a step similar to that of the first embodiment (see FIG. 6B).

By executing the subsequent steps, which are substantially similar to those of the first embodiment, a DRAM shown in FIGS. 10, 11A and 11B is completed.

Where a layout structure for cross-point type cells is adopted, the noise immunity may be adversely affected, lowering the margin of a sensing operation. A number of methods are available to prevent this problem (i.e., there are some measures that can be taken to reduce noise). By adopting such methods in combination with the present invention, a reliable operation is ensured.

(Fourth Embodiment)

Figure 12:
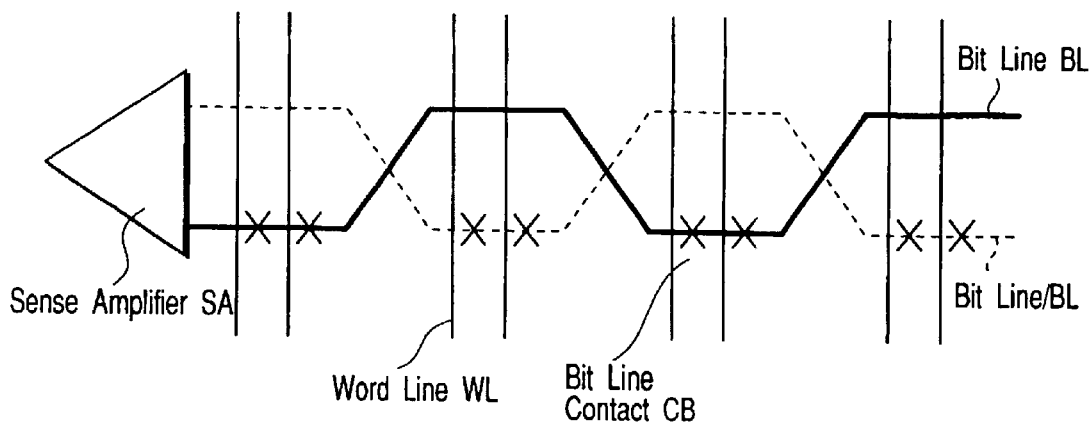
FIG. 12 is a schematic diagram illustrating a multi-layered bit line system.

FIG. 12 is a schematic diagram illustrating a multi-layered bit line system, which is an example of a noise-reducing measure. In the embodiment shown in FIG. 12, two wiring layers (e.g., bit lines BL and /BL) are twisted at a number of positions.

As shown in FIG. 12, double-layered bit lines BL and /BL are formed, and they are twisted at one or more positions. This structure is effective in canceling noise.

Since the DRAM of the fourth embodiment adopts the noise-reducing measure described above, a very stable operation is ensured.

Figure 13:
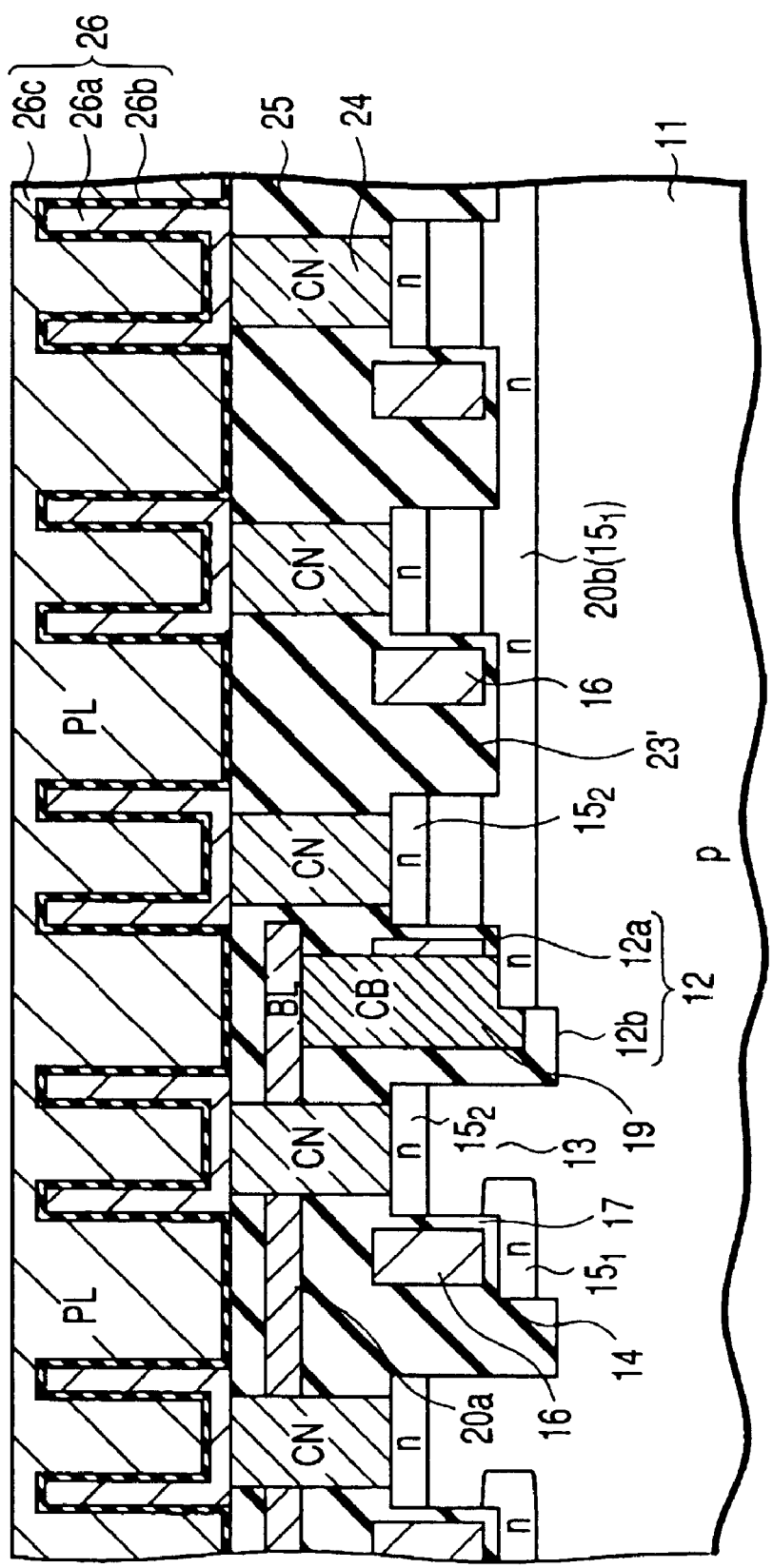
FIG. 13 is a sectional view showing the cell structure of a DRAM according to the fourth embodiment of the present invention.

FIG. 13 shows a cell structure of the DRAM according to the fourth embodiment. FIG. 13 is a schematic cross sectional view of a DRAM and illustrates the case where the multi-layered bit line system shown in FIG. 12 is applied.

As shown in FIG. 13, double-layered bit lines are formed in a section that expands along bit lines. To be more specific, the double-layered bit lines are made up of a wiring layer 20a formed of tungsten and a wiring layer 20b made of a diffusion layer region $15_1$. In practice, the wiring layers 20a and 20b have cross sections that are different in shape. The double-layered bit lines, namely the wiring patterns 20a and 20b, are twisted effectively because of the provision of the bit line contacts 19.

The double-layered bit line system described above is only one example of a noise-reducing measure. Other noise-reducing measures are also known, such as a one-layer bit line system and a method wherein adjacent bit lines are shielded. These noise-reducing measures are also applicable to the DRAMs of the embodiments of the present invention without any problems.

(Fifth Embodiment)

Figure 14:
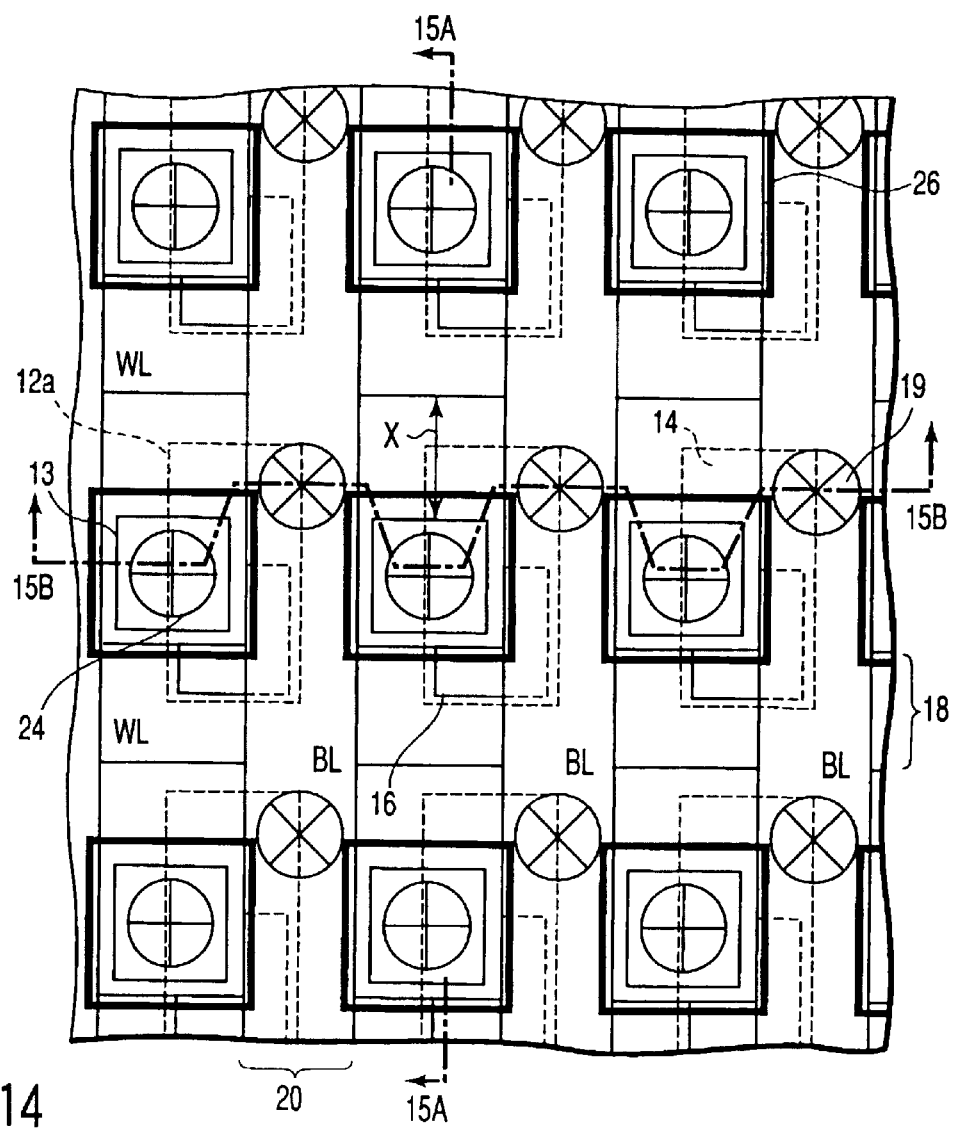
FIG. 14 is a plan view showing the cell layout of a DRAM according to the fifth embodiment of the present invention.
Figure 15A:
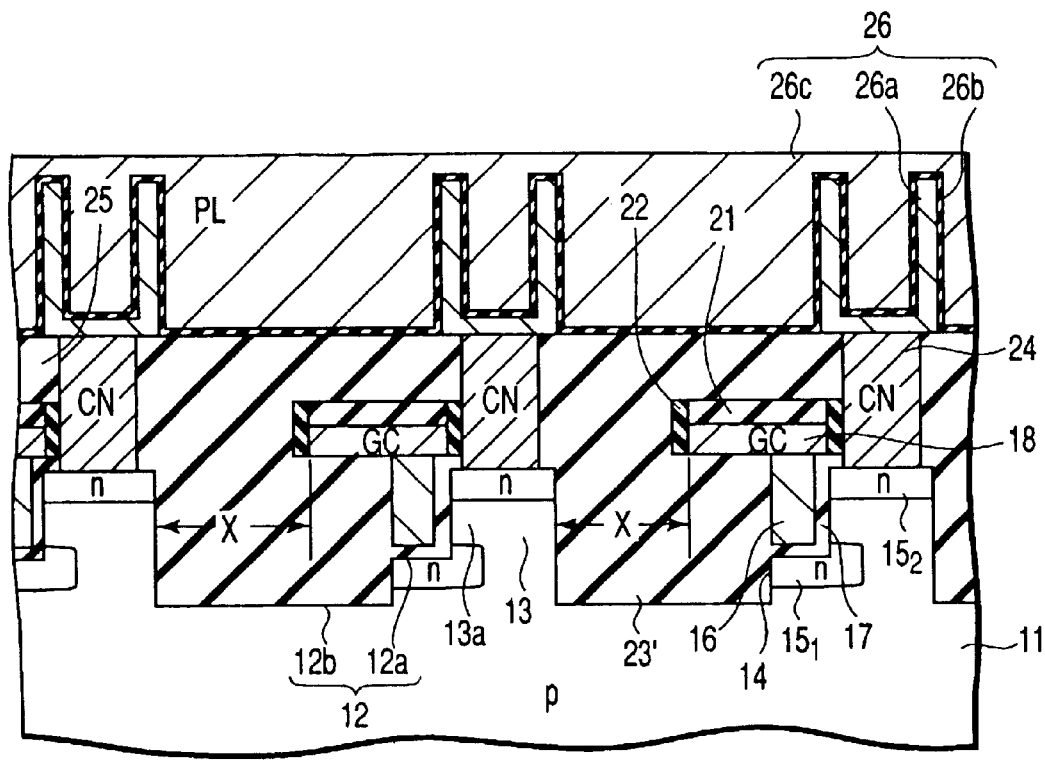
FIG. 15A is a sectional view showing how the cell structure of the DRAM is in the section taken along line 15A—15A of FIG. 14.
Figure 15B:
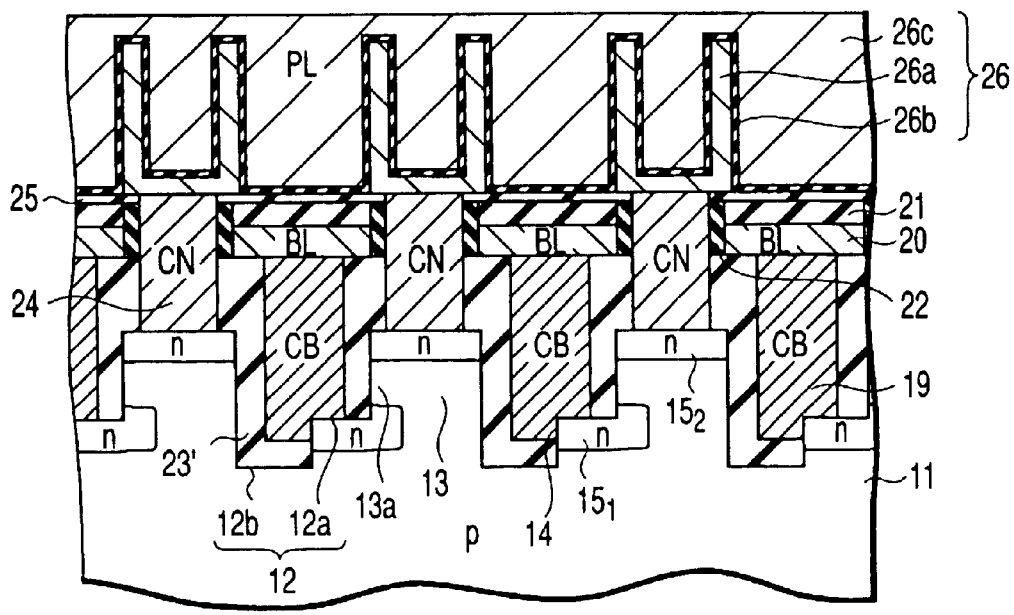
FIG. 15B is a sectional view showing how the cell structure of the DRAM is in the section taken along line 15B—15B of FIG. 14.
Figure 16A:
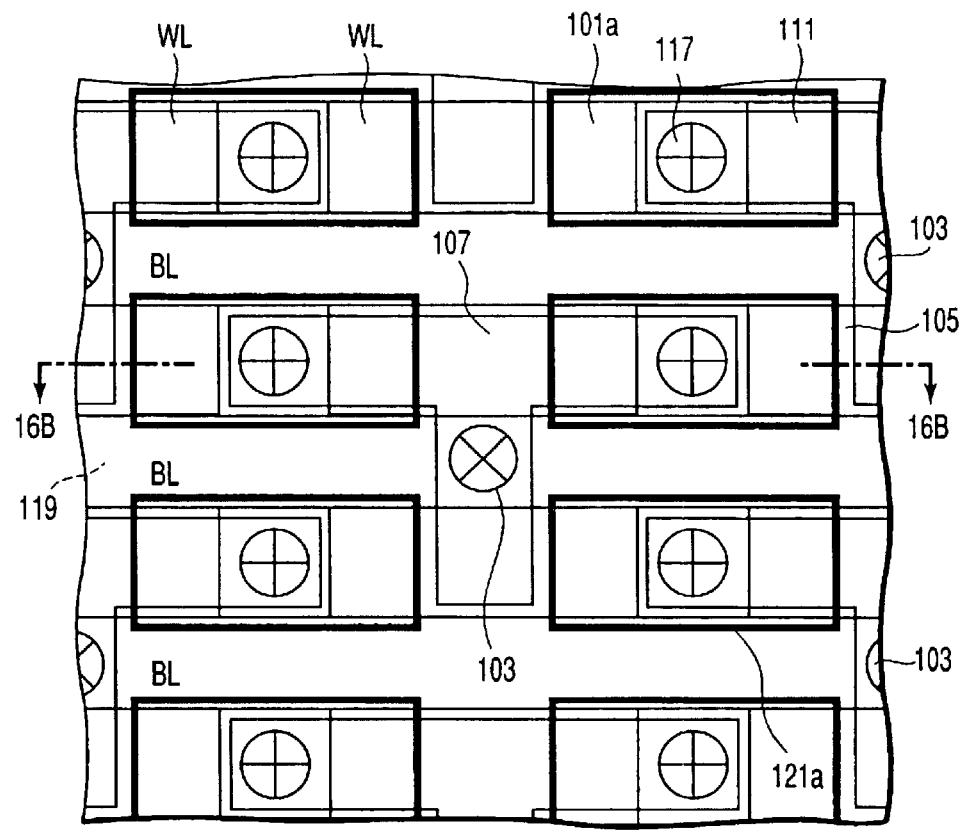
FIG. 16A is a plan view showing a DRAM and illustrating the prior art and the related problems.
Figure 16B:
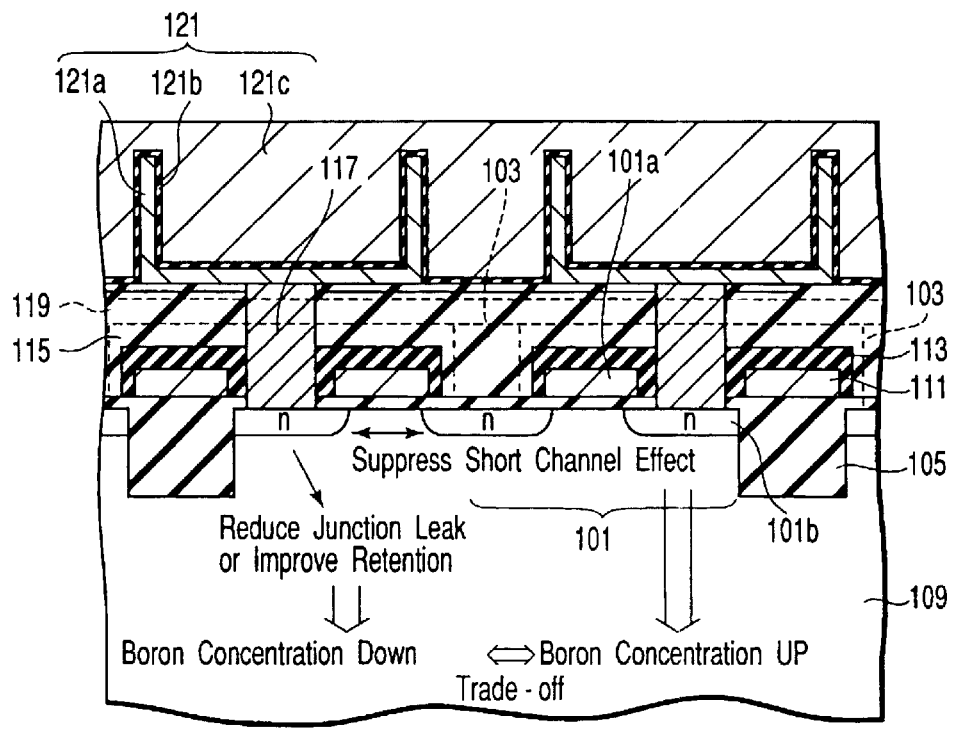
FIG. 16B is a sectional view taken along line 16B—16B of FIG. 16A.

FIGS. 14, 15A and 15B show a cell structure of a DRAM according to the fifth embodiment of the present invention. FIG. 14 is a plan view showing a cell layout, and FIGS. 15A and 15B are sectional views taken along line 15A—15A and line 15B—15B of FIG. 14, respectively.

In the first to third embodiments described above, the minimum working dimension is set at F, and the pitch of the word lines 18 is set at 2F. In this structure, however, the coupling due to potential fluctuations from an adjacent word line 18 may give rise to leakage or damage to storage data in an unselected cell.

In the DRAM shown in FIGS. 14, 15A and 15B, the pitch of the bit lines is increased from 2F to 3F, so as to prevent damage to the storage data. In the fifth embodiment, the minimum occupation area is $6F^2$ per cell (the pitch of word lines 18 is 2F).

As shown in FIGS. 14 and 15A, each silicon column 13 and the word lines corresponding to it are located close to each other. However, the word lines 18 corresponding to a given silicon column 13 are away from the adjacent silicon columns 13 by space X, which is nearly equal to minimum working dimension F. With this structure, the word lines 18 corresponding to the given silicon column 13 do not have any adverse effects on the vertical cell transistors formed by use of the adjacent cells. To be more specific, the vertical-type cell transistors are not undesirably turned on. Hence, the coupling due to potential fluctuations from an adjacent word line 18 does not give rise to damage to storage data in an unselected cell.

In the case of the fifth embodiment, the intervals between the bit line contacts 19 and the vertical-type gate electrodes 16 can be increased. Where the intervals are increased, short-circuiting can be suppressed, and a high manufacturing yield is ensured.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a plurality of columnar portions formed in memory cell array regions on a semiconductor substrate, said columnar portions being isolated by a plurality of trenches having first and second bottoms which are different in depth;
    a plurality of cell transistors including first diffusion layer regions formed in said first bottoms shallower than said second bottoms, second diffusion layer regions formed in surface portions of said columnar portions, and a plurality of gate electrodes which are adjacent to said first and second diffusion layer regions and extending along one side-surface portions of said columnar portions;

a plurality of word lines connected to said gate electrodes, respectively;
a plurality of bit lines extending in a direction intersecting with said word lines and connected to said first diffusion layer regions, respectively; and
a plurality of cell capacitors connected to said second diffusion layer regions, respectively.

2. A semiconductor memory device according to claim 1, wherein said cell transistors and said cell capacitors form memory cells, and said memory cells are located at intersections between said word lines and said bit lines.

3. A semiconductor memory device according to claim 1, wherein each of said gate electrodes has a substantially "I"-shaped surface when viewed from above, and said columnar portions have one side-surface portions corresponding to said gate electrodes and functioning as channels of said cell transistors.

4. A semiconductor memory device according to claim 1, wherein each of said gate electrodes has a substantially "L"-shaped surface when viewed from above, and said columnar portions have two side-surface portions corresponding to said gate electrodes and functioning as channels of said cell transistors.

5. A semiconductor memory device according to claim 1, wherein said first diffusion regions are connected to said bit lines through a plurality of bit line contacts, respectively.

6. A semiconductor memory device according to claim 1, wherein said second diffusion regions are connected to said cell capacitors through a plurality of capacitor contacts, respectively.

7. A semiconductor memory device according to claim 6, wherein said capacitor contacts are arranged between said word lines and said bit lines.

8. A semiconductor memory device according to claim 1, wherein said bit lines form a multi-layered bit line structure.

9. A semiconductor memory device according to claim 8, wherein said bit lines include a pair of bit lines which are complementary to each other and intersect with each other at at least one position.

10. A semiconductor memory device according to claim 9, wherein said pair of bit lines are partially formed utilizing said first diffusion layer region.

11. A semiconductor memory device comprising:
a plurality of columnar portions formed in memory cell array regions on a semiconductor substrate, said columnar portions being isolated by a plurality of trenches having first and second bottoms which are different in depth;
a plurality of cell transistors including first diffusion layer regions formed in said first bottoms shallower than said second bottoms and connected to one another in a first direction, second diffusion layer regions formed in surface portions of said columnar portions, and a plurality of gate electrodes which are adjacent to said first and second diffusion layer regions and extending along at least one side-surface portions of said columnar portions;
a plurality of word lines extending in a second direction intersecting with said first diffusion layer regions, said word lines being connected to said gate electrodes, respectively; and
a plurality of cell capacitors connected to said second diffusion layer regions, respectively.

12. A semiconductor memory device according to claim 11, wherein said cell transistors and said cell capacitors form memory cells, and said memory cells are located at intersections between said word lines and said first diffusion layer regions.

13. A semiconductor memory device according to claim 12, wherein said first diffusion layer regions form a plurality of bit lines.

14. A semiconductor memory device according to claim 11, wherein each of said gate electrodes has a substantially "L"-shaped surface when viewed from above, and said columnar portions have two side-surface portions corresponding to said gate electrodes and functioning as channels of said cell transistors.

15. A semiconductor memory device according to claim 11, wherein said second diffusion regions are connected to said cell capacitors through a plurality of capacitor contacts, respectively.

16. A semiconductor memory device according to claim 15, wherein said capacitor contacts are arranged between said word lines.

17. A semiconductor memory device-manufacturing method comprising:
providing a plurality of columnar portions by forming a plurality of first trenches of a first depth in memory cell array regions of a semiconductor substrate;
forming a plurality of first diffusion layer regions by forming first impurity layers in bottoms of said first trenches;
filling said first trenches with a gate electrode material;
selectively removing said gate electrode material from said first trenches by forming a plurality of second trenches of a second depth deeper than said first depth, such that a plurality of gate electrodes extend at least along one side-surface portions of said columnar portions;
forming a plurality of element isolation regions by filling said second trenches with an insulating film;
forming a plurality of word lines which are connected to said gate electrodes;
forming a plurality of second diffusion layer regions by forming second impurity layers in surface portions of said columnar portions;
forming a plurality of bit line contacts which are connected to said first diffusion layer regions;
forming a plurality of bit lines which are connected to said bit line contacts;
forming a plurality of capacitor contacts which are connected to said second diffusion layer regions; and
forming a plurality of cell capacitors which are connected to said capacitor contacts.

18. A semiconductor memory device-manufacturing method according to claim 17, wherein said element isolation regions are formed at a time not only in said memory cell array regions but also in peripheral circuit regions, which are regions other than said memory cell array regions.

19. A semiconductor memory device-manufacturing method according to claim 17, wherein said capacitor contacts are formed in self alignment with said word and bit lines.

20. A semiconductor memory device-manufacturing method according to claim 17, wherein said bit line contacts are formed in self alignment with said word lines.

21. A semiconductor memory device-manufacturing method according to claim 17, wherein said gate electrodes are formed in self alignment with said first trenches.

22. A semiconductor memory device-manufacturing method comprising:
providing a plurality of columnar portions by forming a plurality of first trenches of a first depth in memory cell array regions of a semiconductor substrate;

forming a plurality of first diffusion layer regions serving as bit lines, by linearly forming first impurity layers in bottoms of said first trenches;

filling said first trenches with a gate electrode material;

selectively removing said gate electrode material from said first trenches by forming a plurality of second trenches of a second depth deeper than said first depth, such that a plurality of gate electrodes extend at least along one side-surface portions of said columnar portions;

forming a plurality of element isolation regions by filling said second trenches with an insulating film;

forming a plurality of word lines which are connected to said gate electrodes;

forming a plurality of second diffusion layer regions by forming second impurity layers in surface portions of said columnar portions;

forming a plurality of capacitor contacts which are connected to said second diffusion layer regions; and forming a plurality of cell capacitors which are connected to said capacitor contacts.

23. A semiconductor memory device-manufacturing method according to claim 22, wherein said element isolation regions are formed at a time not only in said memory cell array regions but also in peripheral circuit regions, which are regions other than said memory cell array regions.

24. A semiconductor memory device-manufacturing method according to claim 22, wherein said capacitor contacts are formed in self alignment with said word lines.

25. A semiconductor memory device-manufacturing method according to claim 22, wherein said gate electrodes extend along adjoining two side-surface portions of said columnar portions and surround part of said columnar portions.

* * * * *